(12) United States Patent
Nakanishi et al.

(10) Patent No.: US 9,666,440 B2
(45) Date of Patent: May 30, 2017

(54) POLISHING APPARATUS AND POLISHING METHOD

(71) Applicant: EBARA CORPORATION, Tokyo (JP)

(72) Inventors: Masayuki Nakanishi, Tokyo (JP); Kenji Kodera, Tokyo (JP); Nobuhiro Yanaka, Tokyo (JP)

(73) Assignee: Ebara Corporation, Tokyo (JP)

(*) Notice: Subject to any disclaimer, the term of this patent is extended or adjusted under 35 U.S.C. 154(b) by 685 days.

(21) Appl. No.: 14/142,690

(22) Filed: Dec. 27, 2013

(65) Prior Publication Data

US 2014/0187126 A1 Jul. 3, 2014

(30) Foreign Application Priority Data

Dec. 27, 2012 (JP) ................. 2012-284232

(51) Int. Cl.
*H01L 21/304* (2006.01)
*B24B 9/06* (2006.01)
*B24B 57/02* (2006.01)
*B24B 37/02* (2012.01)
*B24B 9/08* (2006.01)
*H01L 21/02* (2006.01)

(52) U.S. Cl.
CPC ............ *H01L 21/304* (2013.01); *B24B 9/065* (2013.01); *B24B 9/08* (2013.01); *B24B 37/02* (2013.01); *B24B 57/02* (2013.01); *H01L 21/02057* (2013.01); *H01L 21/02087* (2013.01)

(58) Field of Classification Search
CPC ..... B24B 7/228; B24B 21/002; B24B 37/005; B24B 37/042; B24B 37/34; B24B 37/02; B24B 57/02; H01L 21/304

USPC ........................ 451/5, 44, 73, 249, 254, 258
See application file for complete search history.

(56) References Cited

U.S. PATENT DOCUMENTS

| | | | | |
|---|---|---|---|---|
| 6,497,240 B1* | 12/2002 | Kobayashi | ............ | B08B 3/022 134/122 R |
| 6,632,292 B1* | 10/2003 | Aegerter | ............ | C23F 1/18 134/2 |
| 6,933,234 B2* | 8/2005 | Nakamura | ............ | B24B 9/065 134/1.3 |
| 2002/0170574 A1* | 11/2002 | Quarantello | ............ | B08B 1/00 134/6 |

(Continued)

FOREIGN PATENT DOCUMENTS

JP 2003-077918 A 3/2003
JP 2011-161625 8/2011

*Primary Examiner* — Monica Carter
*Assistant Examiner* — Marcel Dion
(74) *Attorney, Agent, or Firm* — Baker & Hostetler LLP

(57) ABSTRACT

A polishing apparatus 100 includes a holding stage 4 that holds a central portion of a back surface of a substrate W, a motor M1 that rotates the holding stage 4, a front surface nozzle 36 that feeds a rinse liquid to a front surface of the substrate W, a back surface nozzle 37 that feeds the rinse liquid to a back surface of the substrate W, a rinse liquid control section 110 that feeds the rinse liquid through the back surface nozzle 37 after a preset time elapses since the start of feeding of the rinse liquid through the front surface nozzle 36 and a polishing head assembly 1A that polishes a peripheral portion of the substrate installed on the holding stage 4 after the rinse liquid control section 110 feeds the rinse liquid to the substrate W.

11 Claims, 9 Drawing Sheets

(56) References Cited

U.S. PATENT DOCUMENTS

| | | | |
|---|---|---|---|
| 2002/0195128 A1* | 12/2002 | Shibagaki | H01L 21/67051 134/26 |
| 2003/0045090 A1* | 3/2003 | Tsuchiya | H01L 21/02074 438/629 |
| 2004/0140499 A1* | 7/2004 | Sato | H01L 21/02063 257/316 |
| 2008/0200100 A1* | 8/2008 | Takahashi | B24B 9/065 451/44 |
| 2008/0207093 A1* | 8/2008 | Ko | B24B 57/02 451/44 |
| 2009/0142992 A1* | 6/2009 | Takahashi | B24B 9/065 451/9 |
| 2010/0022166 A1* | 1/2010 | Kimba | B24B 9/065 451/5 |
| 2010/0288312 A1* | 11/2010 | Frank | H01L 21/6708 134/30 |
| 2011/0237164 A1* | 9/2011 | Seki | B24B 9/065 451/44 |
| 2011/0256811 A1* | 10/2011 | Nakanishi | B24B 9/065 451/41 |
| 2015/0090301 A1* | 4/2015 | Higuchi | H01L 21/67028 134/23 |

\* cited by examiner (a)

POLISHING APPARATUS AND POLISHING METHOD

TECHNICAL FIELD

The present invention relates to a polishing apparatus and a polishing method.

BACKGROUND ART

In view of improved yield in semiconductor fabrication, management of the surface condition of a peripheral portion of a substrate such as a silicon wafer has been gathering attention. That is, in steps of semiconductor fabrication, many materials are deposited on a front surface (device surface) of the substrate to form a device. However, in the fabrication steps, an unwanted film or a roughened surface may be formed in a peripheral portion of the substrate. In addition, in recent years, a method for conveying a substrate with a peripheral portion thereof held by an arm has been common.

In such a background, as various steps are carried out, an unwanted film remaining in the peripheral portion may be peeled off and attached to the device, leading to reduced yield. Thus, a polishing apparatus is conventionally used to polish the peripheral portion of the substrate to remove the unwanted film or the roughened surface.

The peripheral portion of the substrate is polished by, for example, sucking a central portion of a back surface of the substrate to a stage to support the central portion and pressing a polishing tape, a grinding stone, or the like against the peripheral portion of the substrate while rotating the stage.

More specifically, the peripheral portion of the substrate is generally polished by first coating the front surface and back surface of the substrate with a rinse liquid (polishing liquid) such as pure water, and after the front surface and back surface of the substrate are coated with the rinse liquid, pressing the polishing tape, the grinding stone, or the like against the peripheral portion.

In this case, the coating of the rinse liquid may be carried out by feeding the rinse liquid through a front surface rinse nozzle disposed opposite the front surface of the substrate and feeding the rinse liquid through a back surface rinse nozzle disposed opposite the back surface of the substrate, while rotating the stage. The rinse liquid fed to the front surface and back surface of the substrate flows toward the peripheral portion of the substrate by a centrifugal force resulting from the rotation of the substrate. Thus, the front surface and back surface of the substrate are coated with the rinse liquid.

CITATION LIST

Patent Literature

Patent Literature 1: Japanese Patent Laid-Open No. 2011-161625

However, the conventional technique fails to take into account the possibility of particles on the back surface of the substrate flowing around to the front surface of the substrate.

That is, the conventional technique simultaneously feeds the rinse liquid through the front surface rinse nozzle and the back surface rinse nozzle. On the front surface side of the substrate, the rinse liquid is fed to the central portion of the front surface of the substrate and then flows toward the peripheral portion of the substrate. In contrast, on the back surface side of the substrate, the central portion of the back surface of the substrate is held on the stage, and thus, the rinse liquid is fed to a boundary portion (a peripheral portion of the stage) between an area of the back surface of the substrate which is held on the stage and an area of the back surface of the substrate which is not held on the stage. From the boundary portion, the rinse liquid flows toward the peripheral portion of the substrate.

Thus, the back surface rinse liquid may reach the peripheral portion of the substrate earlier than the front surface rinse liquid and then flow around to the front surface side. As a result, the particles attached to the back surface of the substrate may be washed away along with the back surface rinse liquid and flow around to the front surface side of the substrate. As a result, the particles may contaminate the front surface of the substrate, on which the device is formed.

Thus, an object of the present invention is to restrain the particles on the back surface of the substrate from flowing around to the front surface of the substrate.

SUMMARY OF INVENTION

In view of this object, an aspect of the embodiments provides a polishing method for polishing a substrate, includes rotating the stage with the substrate held thereon, starting feeding a liquid to a first surface of the substrate which is not held on the stage, starting feeding the liquid to a second surface of the substrate which is held on the stage after a preset time has elapsed since the start of feeding of the liquid to the first surface of the substrate, and polishing a peripheral portion of the substrate after the liquid is fed to the first surface and the second surface of the substrate.

Additionally, the feeding the liquid may include starting feeding the liquid to the second surface of the substrate held on the stage after a preset time has elapsed since the start of feeding of the liquid to the first surface of the substrate, so that the liquid fed to the first surface of the substrate reaches the peripheral portion of the substrate by a centrifugal force before the liquid fed to the second surface of the substrate reaches the peripheral portion of the substrate by a centrifugal force.

In addition, the rotating the stage may include rotating the stage with a center of the second surface of the substrate held on the stage.

In addition, the feeding the liquid to the first surface of the substrate may include feeding the liquid to a central portion of the first surface of the substrate, and the feeding the liquid to the second surface of the substrate may include feeding the liquid to a boundary portion between an area of the second surface of the substrate which is held on the stage and an area of the second surface of the substrate which is not held on the stage.

Furthermore, an aspect of the embodiments provides a polishing method for polishing a substrate, includes rotating the stage with the substrate held thereon, starting feeding a liquid to a first surface of the substrate which is not held on the stage, feeding the liquid to the first surface of the substrate while feeding the second surface of the substrate with the liquid at a lower flow rate per unit time than the liquid fed to the first surface of the substrate, and polishing a peripheral portion of the substrate after the liquid is fed to the first surface and the second surface of the substrate.

Additionally, the feeding the liquid may include feeding the liquid to the first surface of the substrate while feeding the second surface of the substrate with the liquid at a lower flow rate per unit time than the liquid fed to the first surface of the substrate, so that the liquid fed to the first surface of the substrate reaches the peripheral portion of the substrate by a centrifugal force before the liquid fed to the second surface of the substrate reaches the peripheral portion of the substrate by a centrifugal force.

Furthermore, an aspect of the embodiments provides a polishing apparatus for polishing a substrate, including a stage holding the substrate, a driving section rotating the stage, a first nozzle feeding a liquid to a first surface of the substrate which is not held on the stage, a second nozzle feeding the liquid to a second surface of the substrate which is held on the stage, a control section starting feeding the liquid through the second nozzle after a preset time has elapsed since the start of feeding of the liquid through the first nozzle, and a polishing section polishing a peripheral portion of the substrate held on the stage after the control section feeds the liquid to the first surface and the second surface of the substrate.

Furthermore, the control section may start feeding the liquid through the second nozzle after a preset time has elapsed since the start of feeding of the liquid through the first nozzle, so that the liquid fed to the first surface of the substrate reaches the peripheral portion of the substrate by a centrifugal force before the liquid fed to the second surface of the substrate reaches the peripheral portion of the substrate by a centrifugal force.

Additionally, the stage is configured to hold a center of the second surface of the substrate, the first nozzle is configured to feed the liquid to a central portion of the first surface of the substrate, and the second nozzle is configured to feed the liquid to a boundary portion between an area of the second surface of the substrate which is held on the stage and an area of the second surface of the substrate which is not held on the stage.

In addition, the liquid may be a rinse liquid for polishing the substrate.

Furthermore, an aspect of the embodiments provides a polishing apparatus for polishing a substrate, including a stage holding the substrate, a driving section rotating the stage, a first nozzle feeding a liquid to a first surface of the substrate which is not held on the stage, a second nozzle feeding the liquid to a second surface of the substrate which is held on the stage, a control section feeding the liquid through the first nozzle while feeding, through the second nozzle, the liquid at a lower flow rate per unit time than the liquid fed through the first nozzle, and a polishing section polishing a peripheral portion of the substrate held on the stage after the control section feeds the liquid to the first surface and the second surface of the substrate.

Furthermore, the control section may feed the liquid through the first nozzle while feeding, through the second nozzle, the liquid at a lower flow rate per unit time than the liquid fed through the first nozzle, so that the liquid fed to the first surface of the substrate reaches the peripheral portion of the substrate by a centrifugal force before the liquid fed to the second surface of the substrate reaches the peripheral portion of the substrate by a centrifugal force.

The present invention can restrain particles on a back surface of the substrate from flowing around to a front surface of the substrate.

DESCRIPTION OF EMBODIMENTS

A polishing apparatus and a polishing method according to an embodiment of the present invention will be described with reference to the drawings. The embodiment will be described below taking, as an example, a bevel polishing apparatus that polishes a peripheral portion of a substrate. However, the embodiment is not limited to the bevel polishing apparatus.

Figure 1:
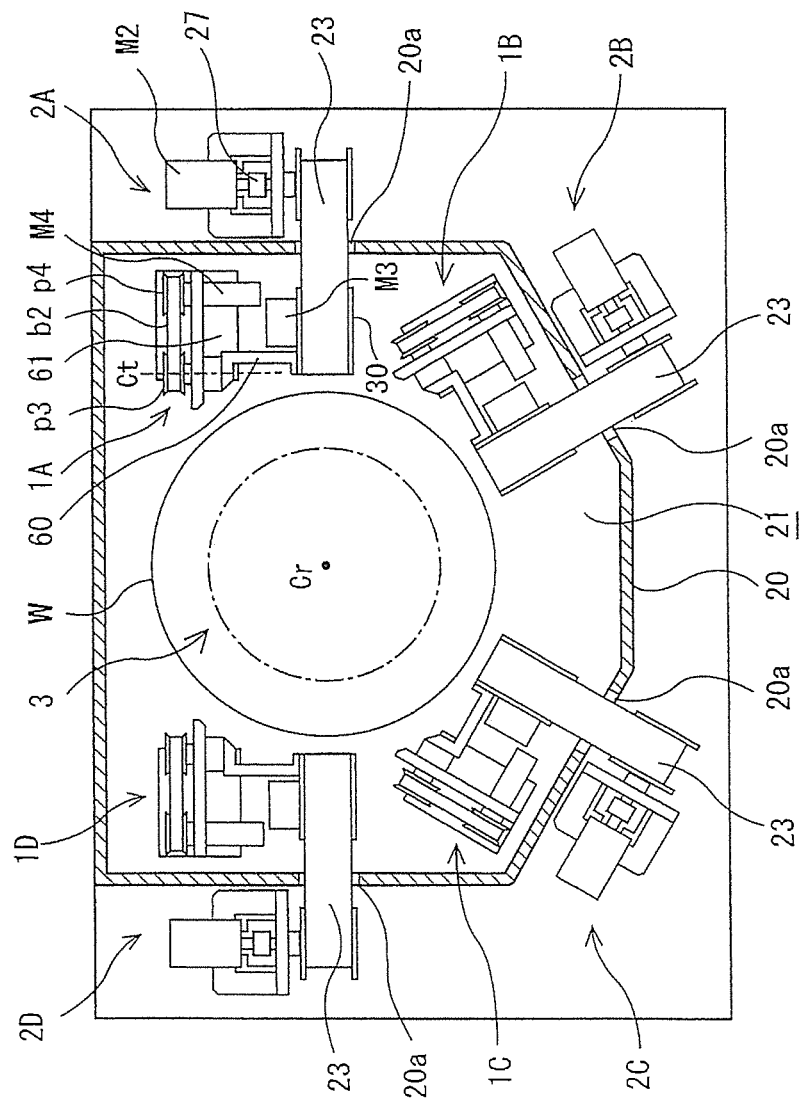
FIG. 1 is a plan view of a polishing apparatus according to an embodiment.
Figure 2:
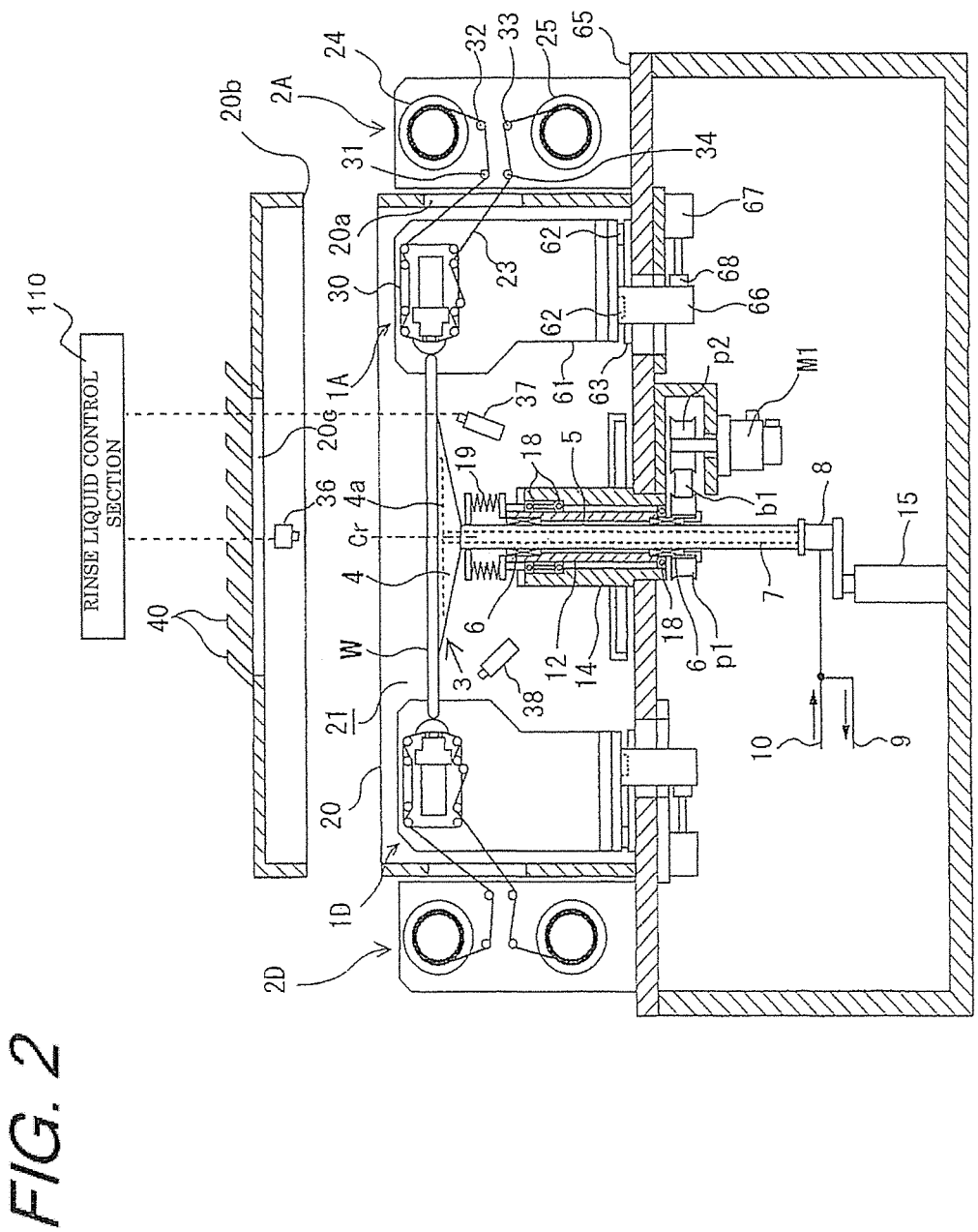
FIG. 2 is a vertical cross-sectional view of the polishing apparatus according to the embodiment.

FIG. 1 is a plan view of a polishing apparatus according to the embodiment. FIG. 2 is a vertical cross-sectional view of the polishing apparatus according to the embodiment. As shown in FIG. 1 and FIG. 2, a polishing apparatus 100 includes a rotary holding mechanism (substrate holding section) 3 holding a substrate (silicon wafer) W that is a polishing target, in a central portion of the mechanism in a horizontal orientation and rotating the substrate W. FIG. 1 shows a state in which the rotary holding mechanism 3 is holding the substrate W.

The rotary holding mechanism 3 includes a dish-like holding stage 4 that holds a back surface (second surface) of the substrate W by vacuum suction, a hollow shaft 5 connected to a central portion of the holding stage 4, and a motor (driving section) M1 that rotates the hollow shaft 5. The substrate W is placed on the holding stage 4 by a hand (not shown in the drawings) of a conveyance mechanism so that the center of the substrate W aligns with the axis of the hollow shaft 5.

The hollow shaft 5 is supported by a ball spline bearing (linear motion bearing) 6 so as to be able to elevate and lower. A groove 4a is formed in an upper surface of the holding stage 4 and is in communication with a communication path 7 extending through the hollow shaft 5. The communication path 7 is connected to a vacuum line 9 via a rotary joint 8 attached to a lower end of the hollow shaft 5. The communication path 7 is also connected to a nitrogen gas feeding line 10 through which the processed substrate W is released from the holding stage 4. The vacuum line 9 and the nitrogen gas feeding line 10 are switched to each other to allow the substrate W to be sucked to and released from the upper surface of the holding stage 4.

The hollow shaft 5 is rotated by a pulley p1 connected to the hollow shaft 5, a pulley p2 attached to a rotating shaft of a motor M1, and a belt b1 passed around the pulleys p1 and p2. The rotating shaft of the motor M1 extends parallel to the hollow shaft 5. In this configuration, the substrate W held on the upper surface of the holding stage 4 is rotated by the motor M1. When a rinse liquid (liquid) is fed to the substrate W, the substrate W is rotated at, for example, about 100 rpm.

The ball spline bearing 6 is a bearing that permits the hollow shaft 5 to move freely in a longitudinal direction of the hollow shaft 5. The ball spline bearing 6 is fixed to a cylindrical casing 12. Thus, in the embodiment, the hollow shaft 5 is configured to operate linearly upward and downward relative to the casing 12. The hollow shaft 5 and the casing 12 rotate integrally. The hollow shaft 5 is connected to an air cylinder (elevating and lowering mechanism) 15. The air cylinder 15 is adapted to elevate and lower the hollow shaft 5 and the holding stage 4.

A radial bearing 18 is installed between the casing 12 and a cylindrical casing 14 concentrically disposed outside the casing 12. The casing 12 is supported by the radial bearing 18 so as to be rotatable. In this configuration, the rotary holding mechanism 3 allows the substrate W to rotate around a center axis Cr thereof and to elevate and lower along the center axis Cr.

As shown in FIG. 1, four polishing head assemblies (polishing section) 1A, 1B, 1C, and 1D are disposed around the substrate W held on the rotary holding mechanism 3. Polishing tape feeding mechanisms 2A, 2B, 2C, and 2D are provided radially outside the polishing head assemblies 1A, 1B, 1C, and 1D, respectively. The polishing head assemblies 1A, 1B, 1C, and 1D are isolated from the polishing tape feeding mechanisms 2A, 2B, 2C, and 2D by a partitioning wall 20.

An internal space in the partitioning wall 20 forms a polishing chamber 21. The four polishing head assemblies 1A, 1B, 1C, and 1D and a holding stage 4 are disposed in the polishing chamber 21. On the other hand, the polishing tape feeding mechanisms 2A, 2B, 2C, and 2D are disposed outside the partitioning wall 20 (that is, outside the polishing chamber 21). The polishing head assemblies 1A, 1B, 1C, and 1D have the same configuration, and the polishing tape feeding mechanisms 2A, 2B, 2C, and 2D also have the same configuration. The polishing head assembly 1A and the polishing tape feeding mechanism 2A will be described below.

The polishing tape feeding mechanism 2A includes a feeding reel 24 that feeds a polishing tape 23 to the polishing head assembly 1A and a recovery reel 25 that recovers the polishing tape 23 used to polish the substrate W. The feeding reel 24 is disposed above the recovery reel 25. Motors M2 are connected to the feeding reel 24 and the recovery reel 25 via couplings 27, respectively (FIG. 1 shows only the coupling 27 and motor M2 connected to the feeding reel 24). Each of the motors M2 is adapted to be able to apply a constant torque in a predetermined rotating direction to exert a predetermined tension on the polishing tape 23.

The polishing tape 23 is an elongate band-like polishing tool with one surface forming a polishing surface. The polishing tape 23 has a base material tape formed of such as a PET sheet and a polishing layer formed on the base material tape. The polishing layer includes a binder (for example, resin) that covers one surface of the base material tape, and abrasive grains held on the binder. A surface of the polishing layer forms the polishing surface. As a polishing tool, a band-like polishing cloth may be used instead of the polishing tape. Furthermore, instead of polishing with the polishing tape, polishing or grinding with a grinding stone may be carried out.

The polishing tape 23 wound around the feeding reel 24 is set in the polishing tape feeding mechanism 2A. A side surface of the polishing tape is supported by a reel plate so as to prevent winding collapse. One end of the polishing tape 23 is attached to the recovery reel 25 so that the polishing tape 23 fed to the polishing head assembly 1A is wound around the recovery reel 25 to recover the polishing tape 23. The polishing head assembly 1A includes a polishing head 30 that brings the polishing tape 23 fed from the polishing tape feeding mechanism 2A into abutting contact with the peripheral portion of the substrate W. The polishing tape 23 is fed to the polishing head 30 so that the polishing surface of the polishing tape 23 faces the substrate W.

The polishing tape feeding mechanism 2A has a plurality of guide rollers 31, 32, 33, and 34. The polishing tape 23 fed to the polishing head assembly 1A and recovered from the polishing head assembly 1A is guided by the guide rollers 31, 32, 33, and 34. The polishing tape 23 is fed from the feeding reel 24 to the polishing head 30 through an opening 20a formed in the partitioning wall 20. The used polishing tape 23 is recovered by the recovery reel 25 through the opening 20a.

As shown in FIG. 2, a front surface nozzle (first nozzle) 36 is disposed above a central portion of a front surface (a first surface or a surface not held on the holding stage 4) of the substrate W to feed a rinse liquid toward the center of the upper surface of the substrate W held by the rotary holding mechanism 3. Furthermore, a back surface nozzle (second nozzle) 37 is disposed below a boundary portion (an outer circumferential portion of the holding stage 4 or a boundary portion between an area of the back surface of the substrate W which is held on the holding stage 4 and an area of the back surface of the substrate W which is not held on the holding stage 4) between the back surface (a second surface or a surface held on the holding stage 4) of the substrate W and the holding stage 4 of the rotary holding mechanism 3 to feed the rinse liquid to the boundary portion. Pure water is normally used as the rinse liquid. However, ammonia may be used if, for example, silica is used as abrasive grains for the polishing tape 23. Furthermore, the rinse liquid is fed before the peripheral portion of the substrate W is polished (pre-rinse). Feeding the rinse liquid to the front surface of the substrate W allows the front surface of the substrate W to be coated with the rinse liquid during polishing. Additionally, feeding the rinse liquid to the back surface of the substrate W allows the back surface of the substrate W to be coated during polishing and also allows the substrate W to be more appropriately sucked to the holding stage 4.

Moreover, the polishing apparatus 100 includes a washing nozzle 38 that washes the polishing head 30 after a polishing process. After the substrate W is elevated by the rotary holding mechanism 3 after the polishing process, the polishing head 30 subjected to the polishing process can be washed by injecting washing water toward the polishing head 30.

The polishing apparatus 100 according to the embodiment includes a rinse liquid control section 110 that controls the amount of rinse liquid fed through the front surface nozzle 36 and the back surface nozzle 37, a feed timing, or the like. The rinse liquid control section 110 will be described below in detail.

Upper ends of the hollow shaft 5 and the casing 12 are connected together by a bellows 19 that is telescopic in an up-down direction as shown in FIG. 2 so that, when the hollow shaft 5 is elevated from or lowered toward the casing 12, mechanisms such as the ball spline bearing 6 and the radial bearing 18 are isolated from the polishing chamber 21. FIG. 2 shows a state in which the hollow shaft 5 has lowered and in which the holding stage 4 is in a polishing position. After the polishing process, the substrate W is elevated by the air cylinder 15 to a conveyance position along with the holding stage 4 and the hollow shaft 5. In the conveyance position, the substrate W is released from the holding stage 4.

The partitioning wall 20 includes a conveyance port 20b through which the substrate W is loaded into and unloaded from the polishing chamber 21. The conveyance port 20b is formed as a cutout extending in a horizontal direction. Thus, the substrate W gripped by the conveyance mechanism can traverse the inside of the polishing chamber 21 through the conveyance port 20b while maintaining a horizontal state. The partitioning wall 20 includes an opening 20c and a louver 40 formed on an upper surface thereof and an exhaust port (not shown in the drawings) formed in a lower surface thereof. During the polishing process, the conveyance port 20b is closed by a shutter (not shown in the drawings). Thus, when the polishing chamber 21 is exhausted through the exhaust port by a fan mechanism (not shown in the drawings), a downward flow of cleaned air is formed inside the polishing chamber 21. The polishing process is carried out in this state, and thus, the polishing liquid is prevented from spattering upward. Consequently, the polishing process can be performed with an upper space in the polishing chamber 21 kept clean.

As shown in FIG. 1, the polishing head 30 is fixed to one end of an arm 60 configured to be rotatable around an axis of rotation Ct parallel to a tangential direction of the substrate W. The other end of the arm 60 is connected to a motor 4 via pulleys p3 and p4 and a belt b2. When the motor M4 rotates clockwise or counterclockwise through a predetermined angle, the arm 60 rotates around the axis Ct through a predetermined angle. According to the embodiment, the motor M4, the arm 60, the pulleys p3 and p4, and the belt b2, form a tilt mechanism that tilts the polishing head 30 relative to the front surface of the substrate W.

The tilt mechanism is mounted on a movable carriage 61. The movable carriage 61 is movably connected to a base plate 65 via a guide 62 and a rail 63. The rail 63 extends linearly along a radial direction of the substrate W held on the rotary holding mechanism 3. The movable carriage 61 is adapted to be linearly movable along the radial direction of the substrate W. A connecting plate 66 penetrating the base plate 65 is attached to the movable carriage 61. A linear actuator 67 is connected to the connecting plate 66 via a joint 68. The linear actuator 67 is fixed directly or indirectly to the base plate 65.

An air cylinder or a combination of a positioning motor and a ball screw may be adopted as the linear actuator 67. The linear actuator 67, the rail 63, and the guide 62 form a moving mechanism that moves the polishing head 30 linearly in the radial direction of the substrate W. That is, the moving mechanism operates to move the polishing head 30 closer to and away from the substrate W along the rail 63. On the other hand, the polishing tape feeding mechanism 2A is fixed to the base plate 65.

Figure 3:
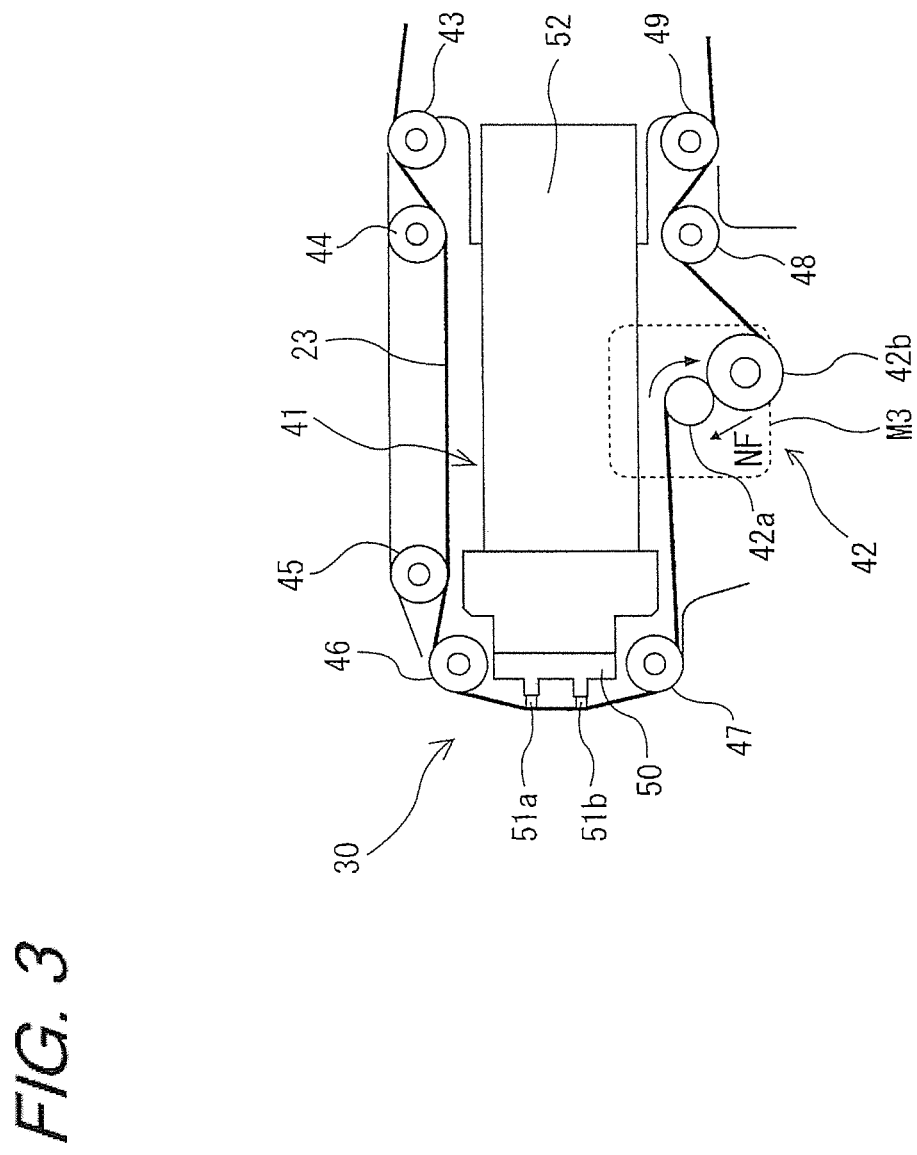
FIG. 3 is an enlarged view of a polishing head.

FIG. 3 is an enlarged view of the polishing head 30. As shown in FIG. 3, the polishing head 30 includes a pressing mechanism 41 that presses the polishing surface of the polishing tape 23 by a predetermined force against the substrate W. Furthermore, the polishing head 30 includes a tape feeding mechanism 42 that feeds the polishing tape 23 from the feeding reel 24 to the recovery reel 25. The polishing head 30 has a plurality of guide rollers 43, 44, 45, 46, 47, 48, and 49 that guide the polishing tape 23 so that the polishing tape 23 advances in a direction orthogonal to the tangential direction of the substrate W.

The tape feeding mechanism 42 provided in the polishing head 30 includes a tape feeding roller 42a, a tape gripping roller 42b, and a motor M3 that rotates the tape feeding roller 42a. The motor M3 is provided on a side surface of the polishing head 30, and the tape feeding roller 42a is attached to a rotating shaft of the motor M3. The tape gripping roller 42b is disposed adjacent to the tape feeding roller 42a. The tape gripping roller 42b is supported by a mechanism (not shown in the drawings) so as to exert a force in a direction shown by an arrow NF in FIG. 3 (a direction toward the tape feeding roller 42a) and is configured to press the tape feeding roller 42a.

When the motor M3 is rotated in the direction of an arrow in FIG. 3, the tape feeding roller 42a is rotated to allow the polishing tape 23 to be fed from the feeding reel 24 to the recovery reel 25 via the polishing head 30. The tape gripping roller 42b is configured to be rotatable around a shaft thereof and rotates in conjunction with feeding of the polishing tape 23.

The pressing mechanism 41 includes a pressing member 50 disposed on a back surface side of the polishing tape 23 and an air cylinder (driving mechanism) 52 that moves the pressing member 50 toward the peripheral portion of the substrate W. The air cylinder 52 is what is called a single rod cylinder. Controlling an air pressure supplied to the air cylinder 52 adjusts a force that presses the polishing tape 23 against the substrate W. The following mechanisms are configured to be able to operate independently: the tilt mechanism, the pressing mechanism 41, and the tape feeding mechanism 42 for the four polishing head assemblies 1A, 1B, 1C, and 1D disposed around the substrate W, and the moving mechanism that moves each of the polishing head assemblies. Furthermore, as shown in FIG. 3, the pressing member 50 has two projecting portions 51a and 51b formed on a front surface thereof. The projecting portions 51a and 51b are shaped like rails extending in the horizontal direction and are disposed in parallel.

Figure 4:
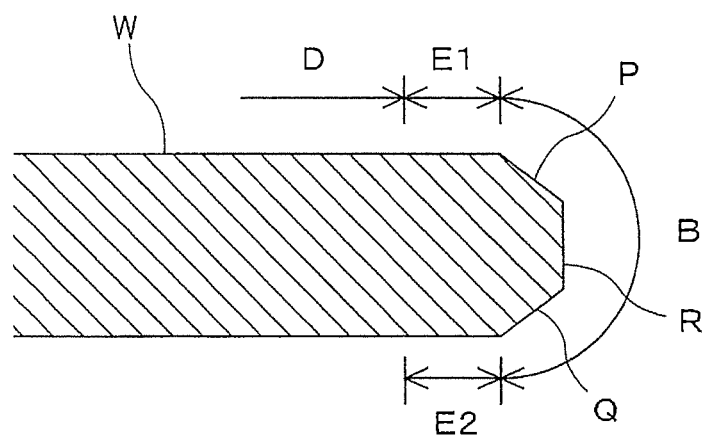
FIG. 4 is an enlarged cross-sectional view showing a peripheral portion of the substrate.
Figure 4:
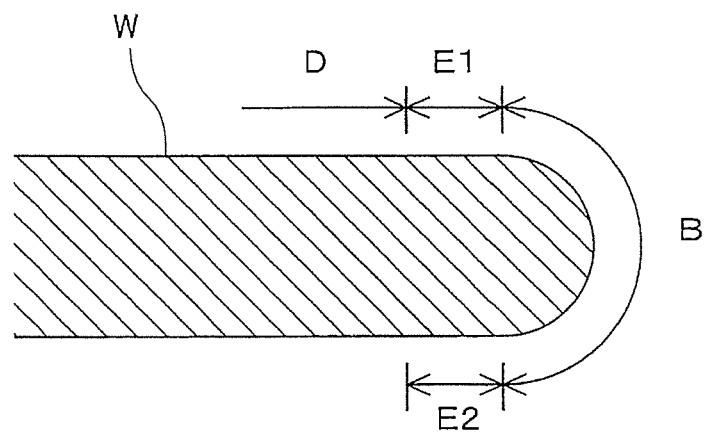

Now, the peripheral portion of the substrate polished by the polishing apparatus 100 according to the embodiment will be described in detail. FIG. 4A and FIG. 4B are enlarged cross-sectional views showing the peripheral portion of the substrate. More specifically, FIG. 4A is a cross-sectional view of what is called a straight substrate, and FIG. 4B is a cross-sectional view of what is called a round substrate. In the substrate W in FIG. 4A, a bevel portion refers to a portion B including an upper inclined portion (upper bevel portion) P, a lower inclined portion (lower bevel portion) Q, and a side portion (apex) R which portions form the outermost circumferential surface of the substrate W. In the substrate W in FIG. 4B, the bevel portion refers to a portion B forming the outermost circumferential surface of the substrate W and having a curved cross section.

Furthermore, a top edge portion refers to a flat portion E1 that is an area positioned radially inward of the bevel portion B and radially outward of an area D in which the device is formed. A bottom edge portion refers to a flat portion E2 positioned opposite the top edge portion and radially inward of the bevel portion B. The top edge portion E1 and the bottom edge portion E2 are sometimes collectively referred to as a near edge portion.

The polishing apparatus 100 according to the embodiment is adapted to be able to polish the bevel portion by tilting the polishing head by the tilt mechanism. For example, an upper projecting portion (first projecting portion) 51a is positioned above the peripheral portion of the substrate W and opposite the top edge portion when the polishing head 30 is tilted upward. A lower projecting portion (second projecting portion) 51b is positioned below the peripheral portion of the substrate W and opposite the bottom edge portion when the polishing head 30 is tilted downward. When the top edge portion is polished, the polishing head 30 is tilted upward and the polishing tape 23 is pressed against the peripheral portion of the substrate W (that is, the top edge portion) from above by the projecting portion 51a. On the other hand, when the bottom edge portion is polished, the polishing head 30 is tilted downward and the polishing tape 23 is pressed against the peripheral portion of the substrate W (that is, the bottom edge portion) from below by the projecting portion 51b. The pressing forces of the projecting portions 51a and 51b can be adjusted by the air cylinder 52.

Figure 5:
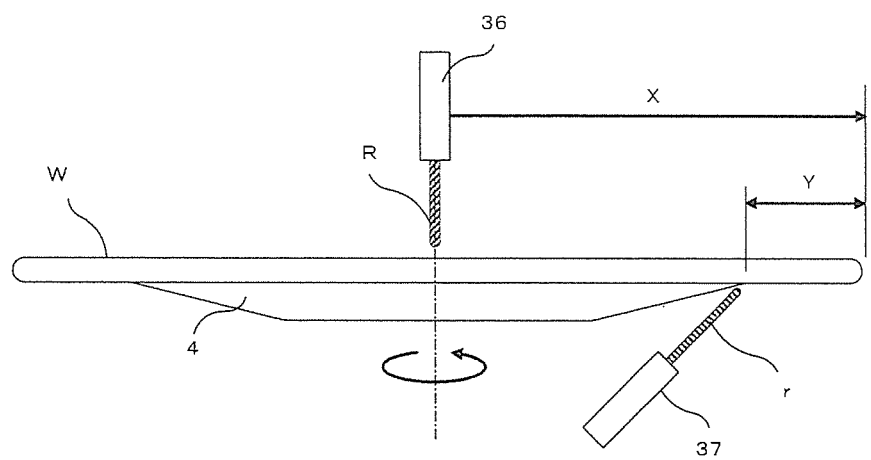
FIG. 5 is a diagram schematically showing feeding of a rinse liquid in a comparative example.
Figure 5:
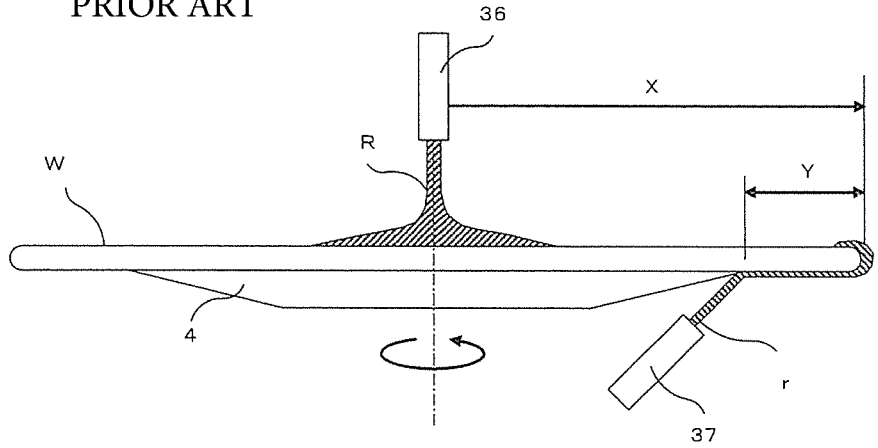

Now, a control aspect of the rinse liquid control section 110 will be described. First, a comparative example will be described. FIG. 5 is a diagram schematically showing feeding of the rinse liquid in the comparative example. FIG. 5A is showing a state in which feeding of the rinse liquid has been started. FIG. 5B shows a state in which a predetermined time has elapsed since the start of feeding of the rinse liquid.

As shown in FIG. 5A, in the comparative example, rinse liquids R and r simultaneously start to be fed through the front surface nozzle 36 and the back surface nozzle 37 while the substrate W is in rotation. The rinse liquids R and r fed to the front surface and back surface of the substrate W flow toward the peripheral portion of the substrate W by a centrifugal force resulting from rotation of the substrate W.

Then, the predetermined time later, the rinse liquid r fed to the back surface of the substrate W reaches the peripheral portion of the substrate W earlier than the rinse liquid R fed to the front surface of the substrate W as shown in FIG. 5B. That is, a distance Y (for example, about 33 mm) to the peripheral portion of the substrate W from the portion of the back surface of the substrate W to which the rinse liquid is fed is shorter than a distance X (for example, about 150 mm) from the central portion of the front surface of the substrate W to the peripheral portion of the substrate W (the portion of the back surface of the substrate W to which the rinse liquid is fed corresponds to the boundary portion between the area of the substrate W held on the holding stage 4 and the area of the substrate W not held on the holding stage 4). Thus, the rinse liquid r fed to the back surface of the substrate W reaches the peripheral portion of the substrate W earlier.

Then, as shown in FIG. 5B, the rinse liquid r from the back surface of the substrate W having reached the peripheral portion of the substrate W may flow around to the front surface side of the substrate W. In this case, particles (dust) attached to the back surface of the substrate W may be washed away along with the rinse liquid on the back surface and flow around to the front surface side of the substrate W. Thus, the front surface of the substrate W may be contaminated. In particular, if a BF (Backing Film) is provided on the back surface of the substrate W to prevent the substrate W from being damaged when the substrate W is sucked to the holding stage, particles attached to the backing film may flow around to the front surface side along with the rinse liquid on the back surface to cause an adverse effect such as metal contamination or dust contamination.

In contrast, according to the embodiment, the rinse liquid control section 110 first feeds the rinse liquid R through the front surface nozzle 36. Then, when a preset time has elapsed since the start of feeding of the rinse liquid R through the front surface nozzle 36, the rinse liquid control section 110 feeds the rinse liquid r through the back surface nozzle 37. This will be described below.

Figure 6:
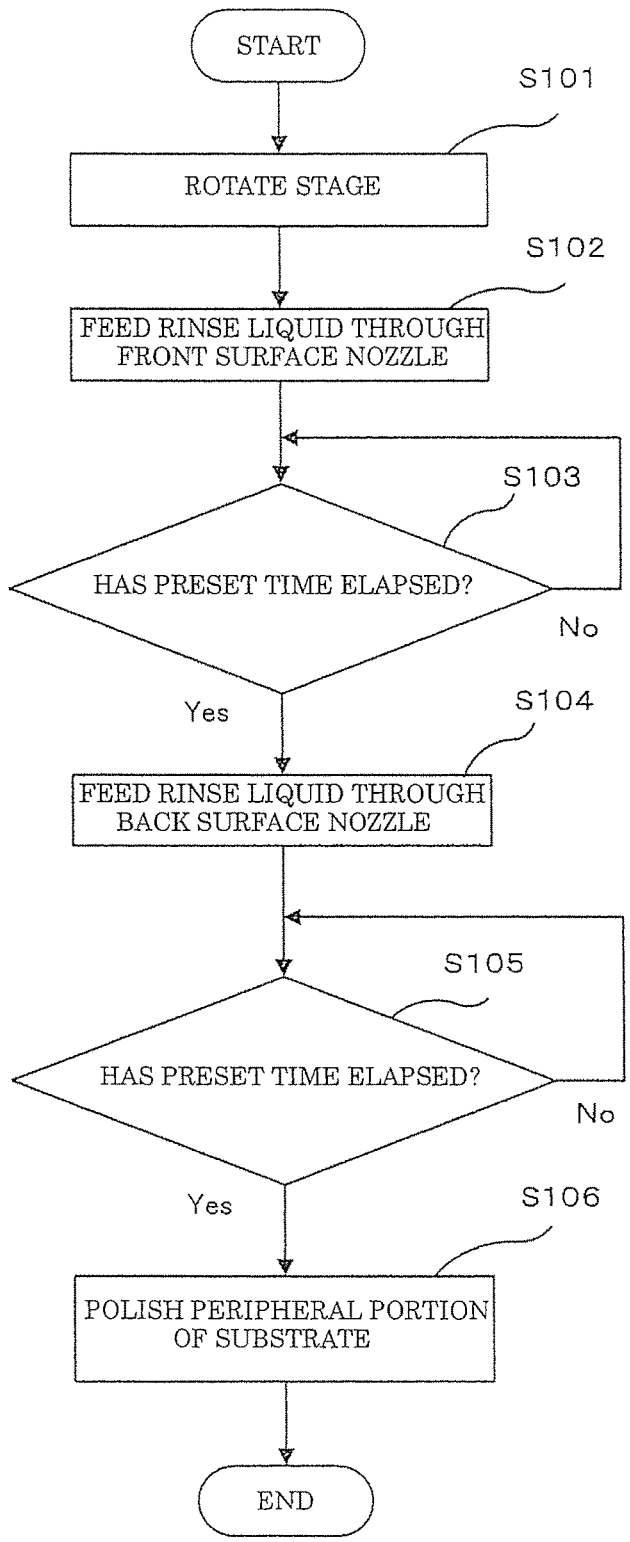
FIG. 6 is a flowchart of a polishing method according to the embodiment.
Figure 7:
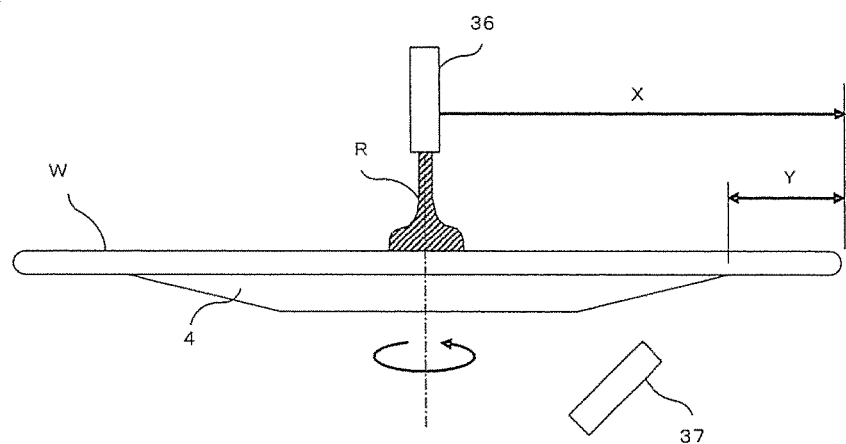
FIG. 7 is a diagram schematically showing feeding of a rinse liquid by a rinse liquid control section according to the embodiment.
Figure 7:
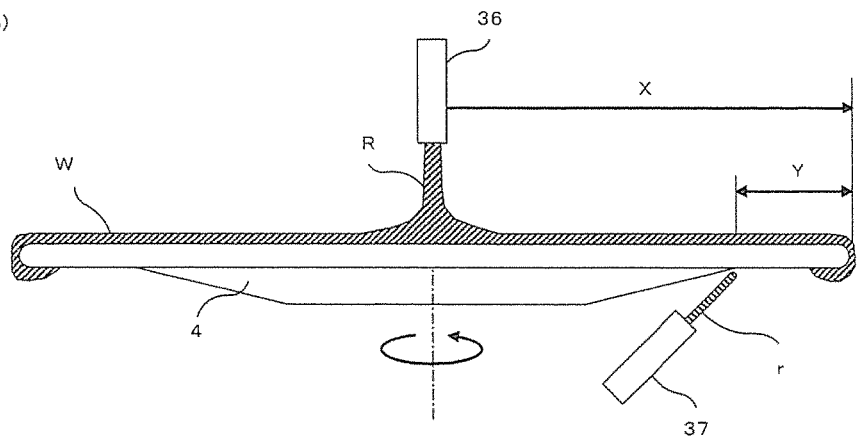

FIG. 6 is a flowchart of a polishing method according to the embodiment. FIG. 7 is a diagram schematically showing feeding of the rinse liquid by the rinse liquid control section according to the embodiment. FIG. 7A shows a state in which the rinse liquid has started to be fed. FIG. 7B shows a state in which a predetermined time has elapsed since the start of feeding of the rinse liquid.

In the polishing method according to the embodiment, first, the holding stage 4 is rotated, as shown in FIG. 6 (step S101). Subsequently, the rinse liquid control section 110 feeds the rinse liquid R through the front surface nozzle 36 (step S102).

This state is shown in FIG. 7A. As shown in FIG. 7A, with the substrate W rotating, the rinse liquid control section 110 feeds the rinse liquid R only through the front surface nozzle 36. The rinse liquid fed to the front surface of the substrate W flows toward the peripheral portion of the substrate W by a centrifugal force resulting from rotation of the substrate W.

Subsequently, the rinse liquid control section 110 determines whether or not a preset time (For example, about 5 seconds) has elapsed since the start of feeding of the rinse liquid R through the front surface nozzle 36 (step S103). The preset time is appropriately determined depending on the rotation speed of the substrate W, the diameter size of the substrate W, the flow rate of the rinse liquid, and the like.

Upon determining that the preset time has not elapsed (step S103, No), the rinse liquid control section 110 repeats the processing in step S103. On the other hand, upon determining that the preset time has elapsed (step S103, Yes), the rinse liquid control section 110 feeds the rinse liquid r through the back surface nozzle 37 (step S104).

FIG. 7B shows a state after the preset time has elapsed. As shown in FIG. 7B, on the front surface side of the substrate W, the rinse liquid R is spread by the centrifugal force of the substrate W and reaches the peripheral portion of the substrate W. Then, the rinse liquid control section 110 feeds the rinse liquid r through the back surface nozzle 37. The rinse liquid control section 110 feeds the rinse liquid R through the front surface nozzle 36 continuously.

Subsequently, the rinse liquid control section 110 determines whether or not a preset time has elapsed since the start of feeding of the rinse liquid r through the back surface nozzle 37 (step S105). That is, the rinse liquid control section 110 waits for a predetermined time to elapse which is enough to allow the rinse liquid control section 110 to determine that a sufficient amount of rinse liquid has been fed to the front and back surfaces of the substrate W. Upon determining that the preset time has not elapsed (step S105, No), the rinse liquid control section 110 repeats the processing in step S105. On the other hand, in the polishing method according to the embodiment, the peripheral portion of the substrate W is polished (step S106) when the rinse liquid control section 110 determines that the preset time has elapsed (step S105, Yes). The polishing head assembly 1A polishes the peripheral portion of the substrate W while the rinse liquid R and the rinse liquid r are being fed to the front and back surfaces of the substrate W.

According to the embodiment, first, the rinse liquid R on the front surface side is fed, and after the predetermined time elapses, the rinse liquid r on the back surface side is fed as shown in FIG. 7B. Thus, the rinse liquid R on the front surface side of the substrate W reaches the peripheral portion of the substrate W earlier than the rinse liquid r on the back surface side of the substrate W. Thus, even upon reaching the peripheral portion of the substrate W, the rinse liquid r on the back surface of the substrate W can be restrained from flowing around to the front surface side. This restrains particles attached to the back surface of the substrate W from being washed away along with the rinse liquid r on the back surface and flowing around to the front surface side of the substrate W to contaminate the front surface of the substrate W. Even if a BF (Backing Film) is provided on the back surface of the substrate W to prevent the substrate W from being damaged when the substrate W is sucked to the holding stage, particles attached to the backing film can be restrained from flowing around to the front surface side along with the rinse liquid r on the back surface.

In the example illustrated in the embodiment, the rinse liquid on the back surface side is fed after the rinse liquid R on the front surface side of the substrate W reaches the peripheral portion of the substrate W. However, the present invention is not limited to this. For example, the rinse liquid control section 110 may feed the rinse liquid on the back surface side at such a timing that the rinse liquid R fed to the front surface of the substrate W reaches the peripheral portion of the substrate W by a centrifugal force before the rinse liquid r fed to the back surface of the substrate W reaches the peripheral portion of the substrate W by a centrifugal force.

Now, an example of control by the rinse liquid control section 110 will be described. The rinse liquid control section 110 can not only control the timing for the rinse liquid but also feed, through the back surface nozzle 37, a rinse liquid having a lower a flow rate than the rinse liquid fed through the front surface nozzle 36. This will be described below.

Figure 8:
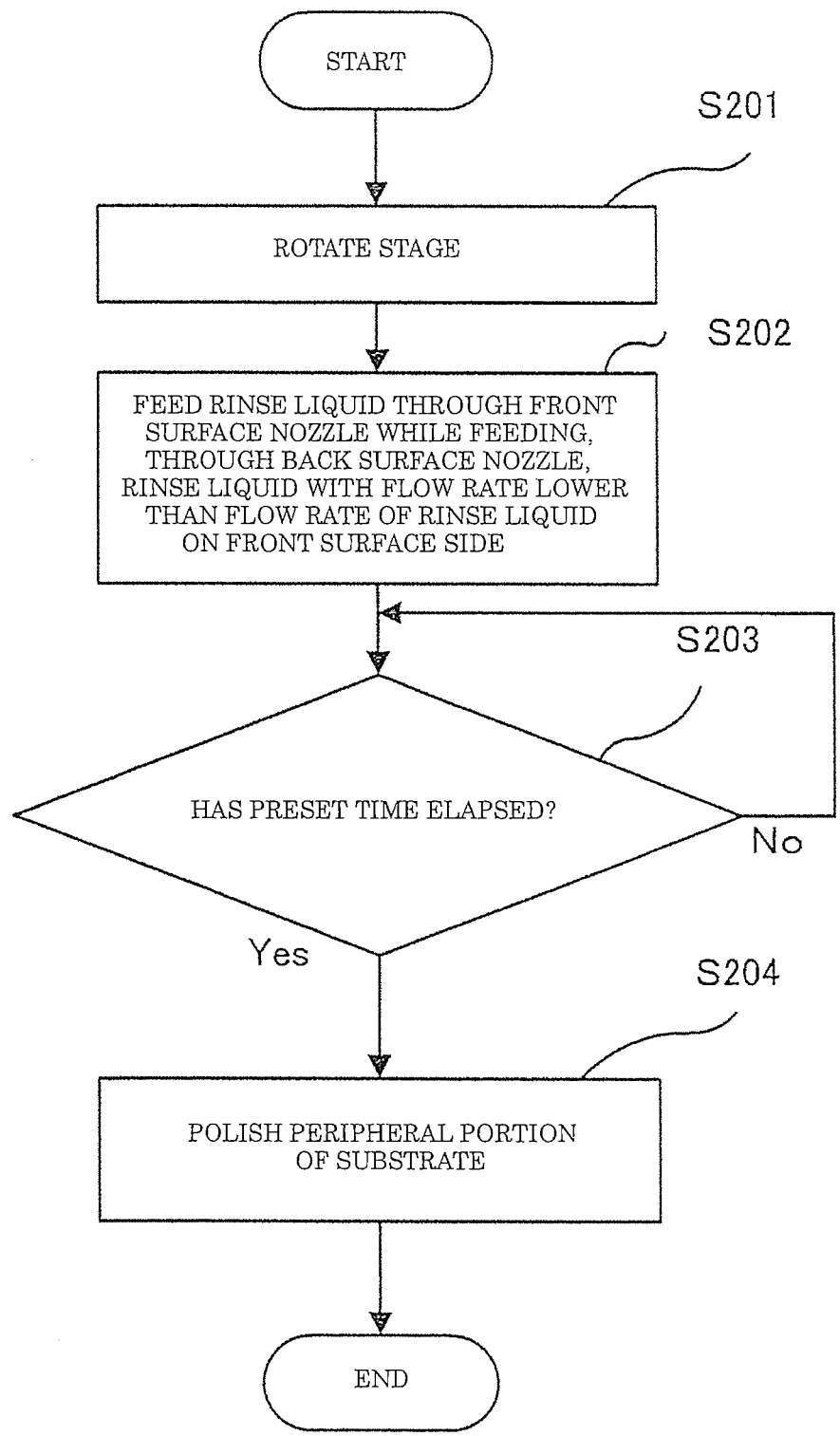
FIG. 8 is a flowchart of another example of the polishing method according to the embodiment.
Figure 9:
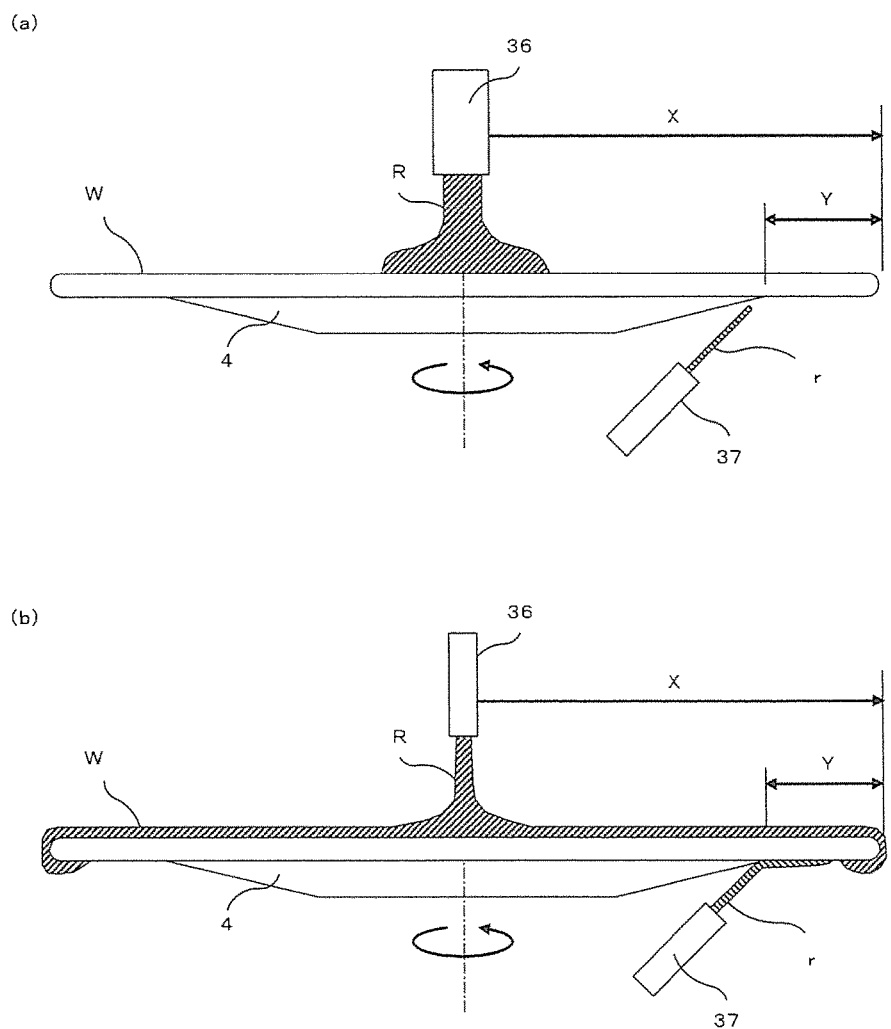
FIG. 9 is a diagram schematically showing another example of the feeding of the rinse liquid by the rinse liquid control section according to the embodiment.

FIG. 8 is a flowchart of another example of the polishing method according to the embodiment. FIG. 9 is a diagram schematically showing another example of feeding of the rinse liquid by the rinse liquid control section according to the embodiment. FIG. 9A shows a state in which the rinse liquid has started to be fed. FIG. 9B shows a state in which a predetermined time has elapsed since the start of feeding of the rinse liquid.

In another example of the polishing method according to the embodiment, first, the holding stage 4 holding the substrate is rotated as shown in FIG. 8 (step S201). Subsequently, the rinse liquid control section 110 feeds the rinse liquid R through the front surface nozzle 36, while feeding, through the back surface nozzle 37, the rinse liquid r having a lower flow rate than the rinse liquid on the front surface side (step S202).

This state is shown in FIG. 9A. As shown in FIG. 9A, the rinse liquid control section 110 feeds the rinse liquids R and r through both the front surface nozzle 36 and the back surface nozzle 37 while the substrate W is in rotation. Here, when the flow rate per unit time of the rinse liquid R fed through the front surface nozzle 36 is denoted by α and the flow rate per unit time of the rinse liquid r fed through the back surface nozzle 37 is denoted by β, the rinse liquid control section 110 feeds the rinse liquids R and r so that α>β. The flow rate α may be set equal to several times to several tens of times as high as the flow rate β. The rinse liquids R and r fed to the front surface and the back surface of the substrate W flow toward the peripheral portion of the substrate W by a centrifugal force resulting from rotation of the substrate W.

Subsequently, the rinse liquid control section 110 determines whether or not a preset time has elapsed since the start of feeding of the rinse liquids R and r through the front surface nozzle 36 and the back surface nozzle 37 (step S203). That is, the rinse liquid control section 110 waits for a predetermined time to elapse which is enough to allow the rinse liquid control section 110 to determine that a sufficient amount of rinse liquid has been fed to the front and back surfaces of the substrate W. Upon determining that the preset time has not elapsed (step S203, NO), the rinse liquid control section 110 repeats the processing in step S203. On the other hand, in the polishing method according to the embodiment, when the rinse liquid control section 110 determines that the preset time has elapsed (step S203, Yes), the peripheral portion of the substrate W is polished (step S204). The polishing head assembly 1A polishes the peripheral portion of the substrate W while the rinse liquid R and the rinse liquid r are being fed to the front and back surfaces of the substrate W.

In the above-described example of the embodiment, a larger amount of rinse liquid R is fed to the front surface side of the substrate W than to the back surface side of the substrate W, and thus, the rinse liquid R on the front surface side flows faster toward the peripheral portion of the substrate W than the rinse liquid r on the back surface side. Consequently, as shown in FIG. 9B, the rinse liquid R on the front surface side of the substrate W reaches the peripheral portion of the substrate W earlier than the rinse liquid r on the back surface side of the substrate W. Therefore, even upon reaching the peripheral portion of the substrate W, the rinse liquid r on the back surface of the substrate W can be restrained from flowing around to the front surface side. This restrains particles attached to the back surface of the substrate W from being washed away along with the rinse liquid r on the back surface and flowing around to the front surface side of the substrate W to contaminate the front surface of the substrate W. Even if a BF (Backing Film) is provided on the back surface of the substrate W to prevent the substrate W from being damaged when the substrate W is sucked to the holding stage, particles attached to the backing film can be restrained from flowing around to the front surface side along with the rinse liquid r on the back surface.

What is claimed is:

1. A polishing method for polishing a substrate, comprising:
   rotating a stage on which the substrate is held;
   feeding a liquid to a first surface of the substrate which is not held on the stage;
   feeding the liquid to a second surface of the substrate which is held on the stage after a predetermined time has elapsed since feeding of the liquid to the first surface of the substrate started; and
   polishing a peripheral portion of the substrate while the liquid is being fed to the first surface and the second surface of the substrate,
   wherein the feeding of the liquid to the second surface starts during the feeding of the liquid to the first surface.

2. The polishing method according to claim 1, wherein the feeding the liquid comprises feeding the liquid to the second surface of the substrate held on the stage after a predetermined time has elapsed since feeding of the liquid to the first surface of the substrate started, so that the liquid fed to the first surface of the substrate reaches the peripheral portion of the substrate by a centrifugal force before the liquid fed to the second surface of the substrate reaches the peripheral portion of the substrate by a centrifugal force.

3. The polishing method according to claim 1, wherein the rotating the stage is rotating the stage with a center of the second surface of the substrate held on the stage.

4. The polishing method according to claim 1, wherein
   the feeding the liquid to the first surface of the substrate is feeding the liquid to a central portion of the first surface of the substrate, and
   the feeding the liquid to the second surface of the substrate is feeding the liquid to a boundary portion between an area of the second surface of the substrate which is held on the stage and an area of the second surface of the substrate which is not held on the stage.

5. The polishing method according to claim 1, wherein the liquid is a rinse liquid for polishing the substrate.

6. The polishing method according to claim 1, wherein the feeding of the liquid to the second surface starts after the liquid fed to the first surface reaches the peripheral portion of the substrate.

7. A polishing apparatus for polishing a substrate, comprising:
   a stage for holding the substrate;
   a driving section for rotating the stage,
   a first nozzle for feeding a liquid to a first surface of the substrate which is not held on the stage,
   a second nozzle for feeding the liquid to a second surface of the substrate which is held on the stage,
   a control section for feeding the liquid through the second nozzle after a predetermined time has elapsed since feeding of the liquid through the first nozzle started; and
   a polishing section for polishing a peripheral portion of the substrate held on the stage while the control section is feeding the liquid to the first surface and the second surface of the substrate,
   wherein the feeding of the liquid to the second surface starts during the feeding of the liquid to the first surface.

8. The polishing apparatus according to claim 7, wherein the control section feeds the liquid through the second nozzle after a predetermined time has elapsed since feeding of the liquid through the first nozzle started, so that the liquid fed to the first surface of the substrate reaches the peripheral portion of the substrate by a centrifugal force before the liquid fed to the second surface of the substrate reaches the peripheral portion of the substrate by a centrifugal force.

9. The polishing apparatus according to claim 7, wherein the stage is configured to hold a center of the second surface of the substrate, the first nozzle is configured to feed the liquid to a central portion of the first surface of the substrate, and the second nozzle is configured to feed the liquid to a boundary portion between an area of the second surface of the substrate which is held on the stage and an area of the second surface of the substrate which is not held on the stage.

10. The polishing apparatus according to claim 7, wherein the liquid is a rinse liquid for polishing the substrate.

11. The polishing apparatus according to claim 7, wherein the feeding of the liquid to the second surface starts after the liquid fed to the first surface reaches the peripheral portion of the substrate.

* * * * *